United States Patent [19]
Oyachi

[11] Patent Number: 5,647,527
[45] Date of Patent: Jul. 15, 1997

[54] METHOD OF DETERMINING ORDER OF WIRE-BONDING

[75] Inventor: Kenji Oyachi, Tokyo, Japan

[73] Assignee: NEC Corporation, Japan

[21] Appl. No.: 597,163

[22] Filed: Feb. 5, 1996

[30] Foreign Application Priority Data

Feb. 9, 1995 [JP] Japan .................................. 7-021459

[51] Int. Cl.$^6$ .................................................. H01L 21/60
[52] U.S. Cl. ........................... 228/180.5; 228/102
[58] Field of Search ........................ 228/1.1, 4.5, 180.5, 228/102, 110.1; 156/73.2

[56] References Cited

U.S. PATENT DOCUMENTS 5,269,452  12/1993  Sterczyk ................................. 228/49.2

FOREIGN PATENT DOCUMENTS 164557  10/1982  Japan .................................. 228/180.5
136193   6/1993  Japan .................................. 228/180.5

OTHER PUBLICATIONS

Electronics, "High-speed-wire and-solder technique tests connections as it makes them", Whitehead, Bob, pp. 111–117, vol. 50, No. 8 Apr. 14, 1977.

IBM Texhnical Disclosure Bulletin, "Alternative to Inteposer for Small Chips in Package", vol. 33, No. 12, p. 22–25 May 1991.

Primary Examiner—Samuel M. Heinrich
Attorney, Agent, or Firm—Hayes, Soloway, Hennessey, Grossman & Hage, P.C.

[57] ABSTRACT

The present invention provides a method of determining an order of wire-bonding between a plurality of leads and a plurality of electrodes, the leads being arranged in two arrays, the electrodes being disposed intermediate between the two arrays of leads in a line on a semiconductor, the method including the steps of (a) surveying whether, if a first wire for connecting a first electrode to a first lead is extended beyond the first electrode, the extended first wire would intersect with a second wire for connecting a second electrode to a second lead, and (b) carrying out wire-boding for the first wire and then wire-bonding for the second wire if the extended first wire would intersect with the second wire.

8 Claims, 8 Drawing Sheets

METHOD OF DETERMINING ORDER OF WIRE-BONDING

BACKGROUND OF THE INVENTION

1. Field of the Invention

The invention relates to a method of wire-bonding for bonding electrodes of a semiconductor device to associated lead pins through a wire, and more particularly to a method of determining an order of wire-bonding.

2. Description of the Related Art

Although a semiconductor device is usually formed with electrodes along a periphery thereof, some semiconductor devices are formed with electrodes 2 longitudinally in a line at the center of a device 1, as illustrated in FIG. 1. Such a device as illustrated in FIG. 1 can be found as a dynamic semiconductor memory.

Each of electrodes of a semiconductor device is to be connected to a lead pin associated therewith through a wire. In the device 1 illustrated in FIG. 1 having the longitudinally, linearly arranged electrodes 2 at the center thereof, lead pins 3 are arranged on a surface of the semiconductor device 1 by means of a double-sided adhesive tape 9, and then connected to the electrodes 2 through a wire 4.

In wire-bonding for connecting each of the electrodes 2 to the associated lead 3 through the wire 4, at a tip end of the wire 4 supported by a capillary 6 is formed a small metal ball 5, for instance, by electric discharge, as illustrated in FIG. 2A. Then, as illustrated in FIG. 2B, the capillary 6 is lowered to thereby compress and hence bond the metal ball 5 onto the electrode 2. Then, the capillary 6 is raised, as illustrated in FIG. 2C. Then, as illustrated in FIG. 2D, the capillary is made to horizontally move away from the lead 3 to which the wire 4 supported by the capillary 6 is to be connected. Since the distal end of the wire 4 is bonded to the electrode 2, there is formed a bending portion 7 in the wire 4 as the capillary 6 moves. The formation of the bending portion 7 advantageously makes uniform the shape of the wires 4 having been bonded to the lead 3, and in particular important for making maximum height of the wire 4 measured from a surface of the semiconductor device 1 uniform.

After the formation of the bending portion 7 of the wire 4, the capillary 6 is made to move towards the lead 3 as the wire 4 is drawn out through the capillary 6, as illustrated in FIG. 2E. When the capillary 6 reaches above the lead 3, the capillary 6 is lowered to compress the wire onto the lead 3 to thereby bond the wire 4 to the lead 3, as illustrated in FIG. 2F.

The above mentioned steps are carried out for bonding the single electrode 2 to the single lead 3 associated therewith through the wire 4. The semiconductor device 1 usually has a plurality of the electrodes 2 and the leads 3. In the device 1 illustrated in FIG. 1, there has to be carried out wire-bonding 26 times, namely, by the number of times equal to the number of the electrodes 2, except so-called non-connect electrodes.

An order of wire-bonding in such 26 times wire-bonding is determined as shown in FIGS. 3A to 3F. In brief, wire-bonding is carried out in accordance with an order at which electrodes are disposed. Namely, a firstly disposed electrode 2-1 located in alignment with a lead 3-1 located at an end of a lead array 3A is first bonded to the lead 3-1 through a wire 4-1, as illustrated in FIG. 3A. Then, a secondly disposed electrode 2-2 located in alignment with a lead 3-2 located at an end of a lead array 3B is secondly bonded to the lead 3-2 through a wire 4-2, as illustrated in FIG. 3B. Then, a thirdly disposed electrode 2-3 is thirdly bonded through a wire 4-3 to a lead 3-3 located adjacent to the lead 3-1, as illustrated in FIG. 3C. In the same way, electrodes 2-4 to 2-26 (not numbered) are successively bonded to leads 3-4 to 3-26 (not numbered) through wires 4-4 to 4-26 (not numbered), as illustrated in FIGS. 3D to 3F.

As having been explained with reference to FIGS. 2A to 2F, in order to uniformalize the shape of the bonded wires 4, the following steps are required: (a) bonding the metal wire ball 5 attached at a tip end of the wire 4 to the electrode 2 disposed on the semiconductor device 1, (b) raising the capillary above the electrode 2, and (c) horizontally moving the wire 4 away from the lead 3 to thereby form the bending portion 7 of the wire 4.

However, as illustrated in FIG. 3D, for instance, before a wire 4-13 is bonded to an electrode 2-13, a wire 4-12 has already been bonded between an electrode 2-12 and a lead 3-12. The capillary has 6 to be moved toward the already bonded wire 4-12 for wire-bonding of the wire 4-13, and hence, the capillary 6 may unpreferably contact the wire 4-12 to thereby deform or break the wire 4-12.

For resolving such a problem, the location of the electrodes 2 and the leads 3 is limited, which brings difficulty in design of a semiconductor device and leads. In addition, it is necessary to prepare additional area in which a capillary can move without obstruction. Such additional area poses a problem of the semiconductor being larger in size.

U.S. Pat. No. 5,269,452 issued to Sterczyk on Dec. 14, 1993 has suggested another method of wire-bonding. The suggested method of bonding each of chip pads of multiple pins to a lead frame includes the step of firstly carrying out wire-bonding for chip pads located at corners of a semiconductor device, and then carrying out wire-bonding for chip pads located at the center of a semiconductor device. These two steps are repeated. An advantage obtained by the method is that an already completed wire does not contact and hence is not deformed by a wire-bonding tool.

SUMMARY OF THE INVENTION

It is an object of the present invention to provide a method of determining an order of wire-bonding which method makes it possible to bond an electrode to a lead associated therewith through a wire without deforming and/or breaking other wires and/or leads.

The present invention provides a method of determining an order of wire-bonding between a plurality of leads and a plurality of electrodes, the leads constituting two arrays, the electrodes being disposed intermediate between the two arrays of leads in a line on a semiconductor, the method including the steps of (a) surveying whether, if a first wire for connecting a first electrode to a first lead is extended beyond the first electrode, the extended first wire would intersect with a second wire for connecting a second electrode to a second lead, and (b) carrying out wire-bonding for the first wire and then wire-bonding for the second wire if the extended first wire would intersect with the second wire.

The present invention further provides a method of determining an order of wire-bonding between a plurality of leads and a plurality of electrodes, the leads constituting two arrays, the electrodes being disposed intermediate between the two arrays of leads in a line on a semiconductor, the method including the step of determining an order of wire-bonding so that an extension of a line connecting an electrode to a lead associated therewith does not intersect with a wire already having been spanned between an electrode and a lead.

The present invention still further provides a method of determining an order of wire-bonding between first, second, third and fourth leads and first, second, third and fourth leads, respectively, the electrodes being disposed in a line on a semiconductor device, the first and second leads being disposed at one of the sides of the electrodes and the third and fourth leads being disposed at the other side of the electrodes, the first, second, third and fourth electrodes being adapted to be connected by wire-bonding to the first, third, fourth and second leads, respectively, the method including the step of determining an order of wire-bonding so that an extension of a line connecting an electrode to a lead associated therewith does not intersect with a wire already having been spanned between an electrode and a lead.

In a preferred embodiment, wire-bonding is carried out in an order as follows: the first electrode to the first lead, the second electrode to the third lead, the third electrode to the fourth lead, and the fourth electrode to the second lead.

The present invention yet further provides a method of determining an order of wire-bonding between a plurality of leads and a plurality of electrodes, the leads constituting two arrays, the electrodes being disposed intermediate between the two arrays of leads in a line on a semiconductor, the method including the steps of (a) grouping wire-bonding into a plurality of groups so that an extension of a line connecting an electrode to a lead in a group does not intersect with a line connecting an electrode to a lead in another group, (b) determining an order of wire-bonding in each of the groups so that an extension of a line connecting an electrode to a lead does not intersect with a wire already having been spanned between an electrode and a lead, and (c) carrying out wire-bonding for each of the groups in any order.

The present invention still yet further provides a method of determining an order of wire-bonding between a plurality of leads and a plurality of electrodes, the leads constituting two arrays, the electrodes being disposed intermediate between the two arrays of leads in a line on a semiconductor, the method including the steps of (a) grouping wire-bonding into a plurality of groups so that an extension of a line connecting an electrode to a lead in a group does not intersect with a line connecting an electrode to a lead in another group, (b) determining an order of wire-bonding in each of the groups so that an extension of a line connecting an electrode to a lead does not intersect with a wire already having been spanned between an electrode and a lead, and (c) carrying out wire-bonding in accordance with the order having been determined in the previous step independently of an order of carrying out wire-bonding for each of the groups.

In a preferred embodiment, a wire with which all of the line extensions do not intersect is first wire-bonded.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 4A:
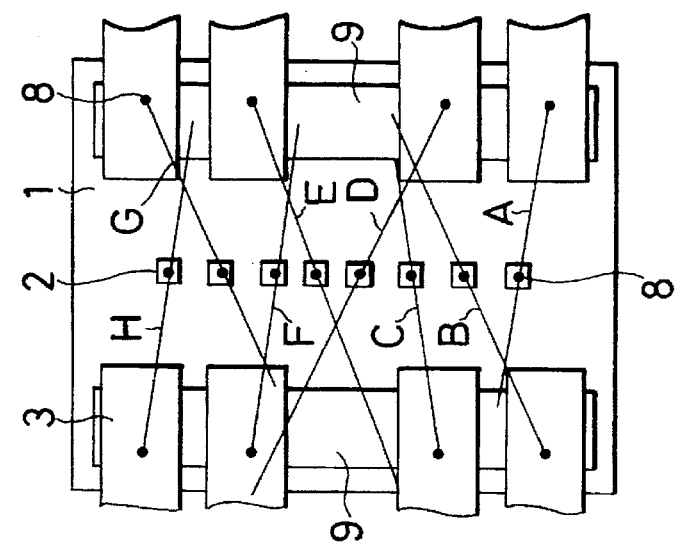
FIG. 4A is a plan view illustrating a part of a semiconductor chip on which wires are spanned between electrodes and leads in accordance with a method of a preferred embodiment of the present invention.

FIG. 4A is a plan view of a semiconductor device to which a method of wire-bonding in accordance with an embodiment of the invention is applied. As mentioned earlier, if wire-bonding for an electrode 208 is to be carried out after wire-bonding for an electrode 207 has been carried out, a wire 407 spanning the electrode 207 and a lead 307 may be deformed or broken. The reason is explained in detail hereinbelow.

Figure 4B:
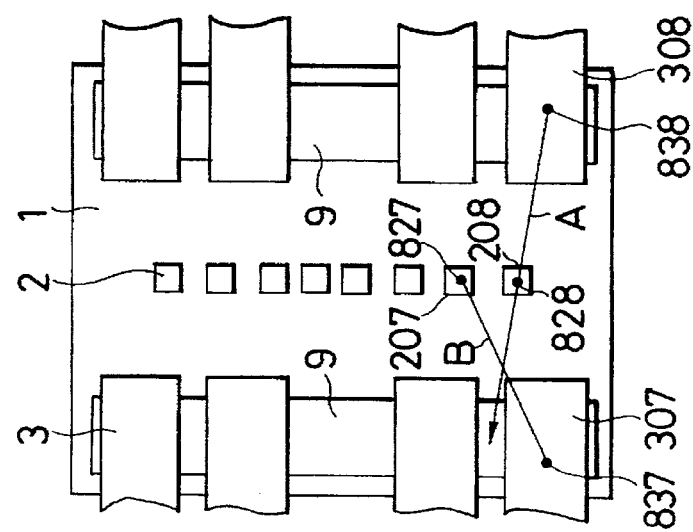
FIGS. 4B and 4C are plan views of a part of a semiconductor device showing how an order of wire-bonding is determined in accordance with an embodiment of the present invention.

With reference to FIG. 4B illustrating a semiconductor device prior to wire-bonding, the wire 407 is to span between a point 827 at which the wire 407 is designed to be connected to the electrode 207 and a point 837 at which the wire 407 is designed to be connected to the lead 307, whereas a wire 408 is to span between a point 828 at which the wire 408 is designed to be connected to an electrode 208 and a point 838 at which the wire 408 is designed to be connected to a lead 308. Herein, if a line A connecting the points 828 and 838 to each other is extended beyond the point 828, the line A would intersect with a line B connecting the points 827 and 837, or the wire 407, as illustrated in FIG. 4B. Thus, if wire-bonding for the wire 408 is carried out after wire-bonding for the wire 407 has been carried out, a capillary would contact the wire 407 to thereby cause the deformation or breakage of the wire 407. The fact that the extended line A beyond the point 828 intersects with the line B indicated that wire-bonding for the wire 407 corresponding to the line B has to be carried out subsequently to wire-bonding for the wire 408 corresponding to the line A.

Figure 4C:
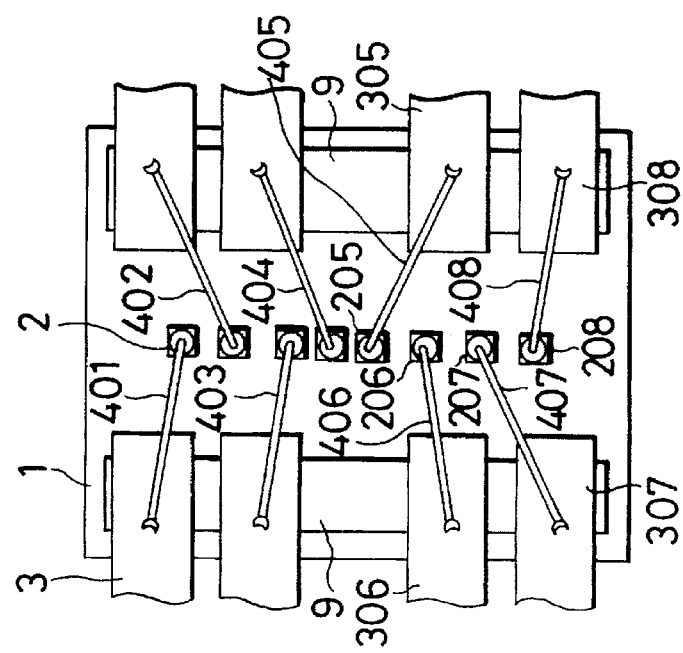

The result obtained by carrying out analysis as having been made with reference to FIG. 4B for all of wires 401 to 408 is shown in FIG. 4C. As is understood in view of FIG. 4C, an order of wire-bonding in a semiconductor device 1 illustrated in FIG. 4A as follows: the wires 408, 407, 406 and 405 in a first group, and the wires 401, 402, 403 and 404 in a second group. Either group may be wire-bonded first. In either group, a wire with which all lines A to H do not intersect is first wire-bonded.

The either group may be first wire-bonded since they are independent from each other with respect to interference of the capillary with the wire in wire-bonding. In addition, wire-bonding for each of the wires may be carried out independently of an order of carrying out wire-bonding for each of the groups. Namely, provided that an order of wire-bonding for the wires in either group is maintained, it is not always necessary to carry out wire-bonding for the wires in a group after wire-bonding for the wires in other group has been completed. For instance, in the semiconductor device 1 illustrated in FIG. 1, an order of wire-bonding may be determined as follows: wires 408, 401, 407, 402, 406, 403, 405 and 404.

Figure 5:
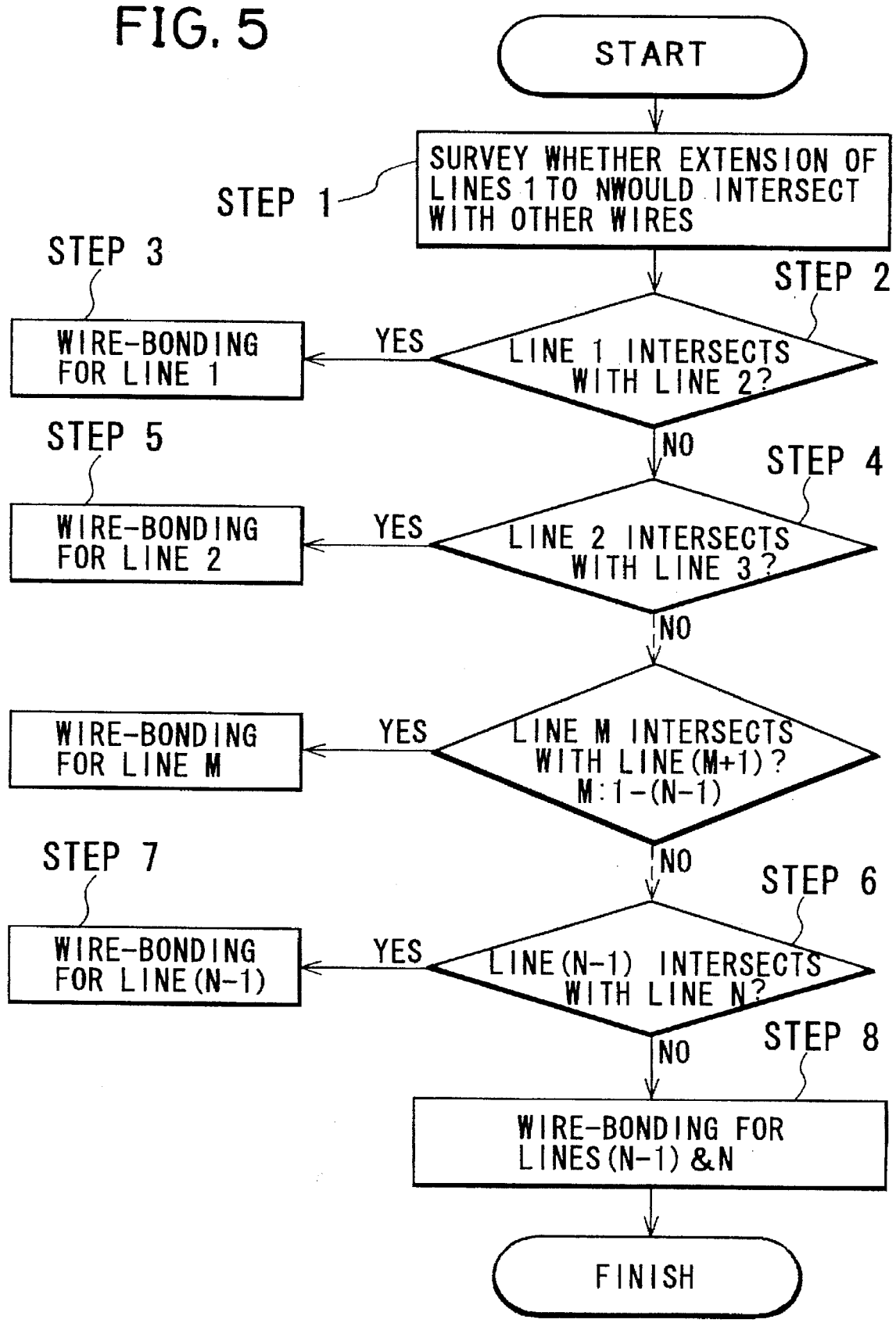
FIG. 5 is a flow chart of a method in accordance with an embodiment of the present invention.

FIG. 5 is a flow chart showing respective steps of a method in accordance with the invention. First, there are supposed lines 1 to N each of which is spanned between an electrode and a lead, similarly to the lines A to N shown in FIG. 4C. Herein, N is a positive integer greater than 1. In step 1, surveyance is carried out as to whether the extended lines 1 to N would intersect with other wires. Then, in step 2, judgment is made as to whether the line 1 would intersect with the line 2 or not. If the answer is YES, wire-bonding for the line 1 is carried out in step 3. If the answer is NO, next judgment is made in step 4 as to whether the line 2 would intersect with the line 3 or not. If the answer is YES, wire-bonding for the line 2 is carried out in step 5. If the answer is NO, judgments are successively made similarly to steps 2 and 4.

In such a manner, judgments are made as to whether the lines M would intersect with the lines (M+1). Herein, M is a positive integer ranging from 1 to (N−1). Finally, judgment is made in step 6 as to whether the line (N−1) would intersect with the line N or not. If the answer is YES, wire-bonding for the line (N−1) is carried out in step 7, whereas if the answer is NO, wire-bondings for the lines N and (N−1) are carried out in step 8. Thus, there is made determination of an order in wire-bonding.

As having been described with reference to a preferred embodiment, in the method of determining an order of wire-bonding between a plurality of leads and a plurality of electrodes in accordance with the present invention, there is first carried out surveyance as to whether, if a first wire for connecting a first electrode to a first lead is extended beyond the first electrode, the extended first wire would intersect with a second wire for connecting a second electrode to a second lead. Then, if the extended first wire would intersect with the second wire, wire-bondings are carried out for the first wire and then the second wire.

In brief, an order of wire-bonding is determined so that an extension of a line connecting an electrode to a lead associated therewith does not intersect with a wire already having been spanned between other electrode and lead.

Accordingly, it is possible to avoid interference of a capillary with wires already having been bonded when the capillary is made to horizontally move away from a lead for formation of a bending portion. Thus, deformation and/or breakage of wires caused due to such interference no longer occur.

Figure 1:
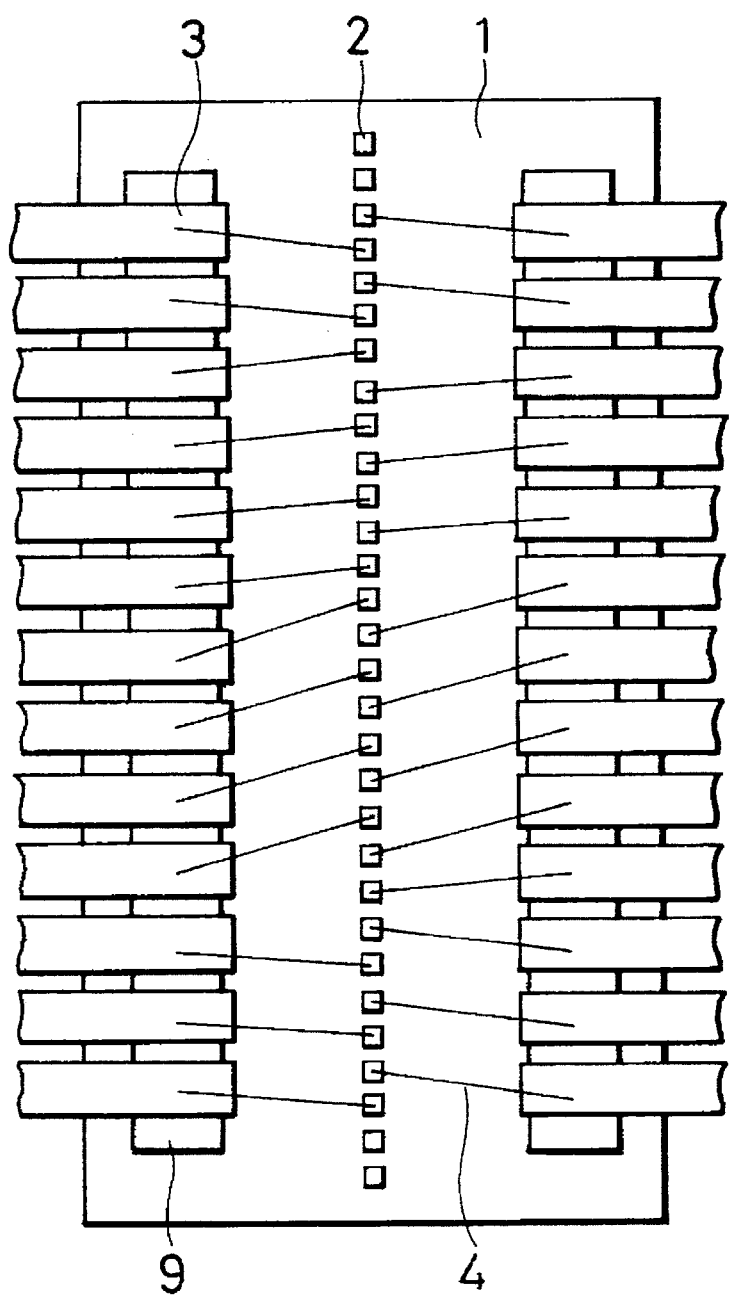
FIG. 1 is a plan view illustrating a semiconductor device on which a plurality of wire-bonded electrodes and leads are disposed.
Figure 2A:
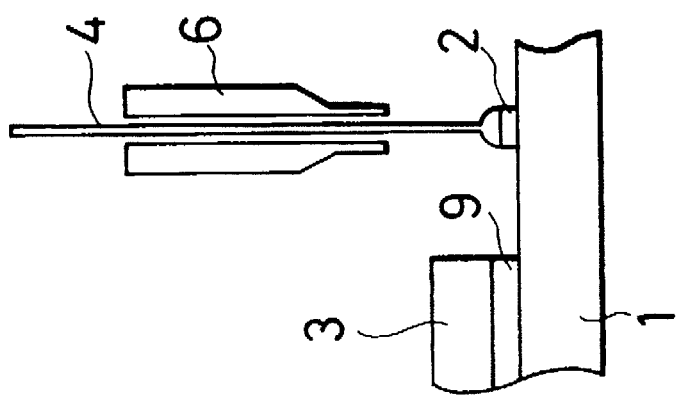
FIGS. 2A to 2F are schematic views showing conventional steps for bonding a wire between an electrode and a lead.
Figure 2B:
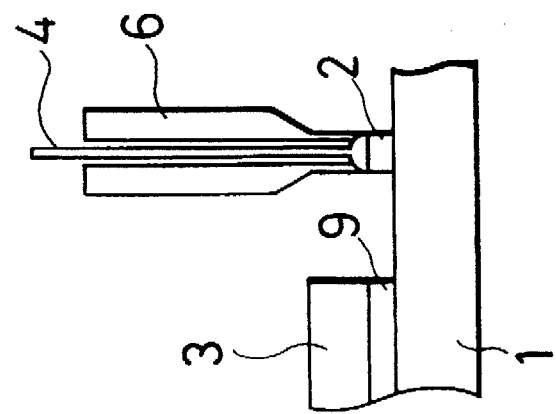
Figure 2C:
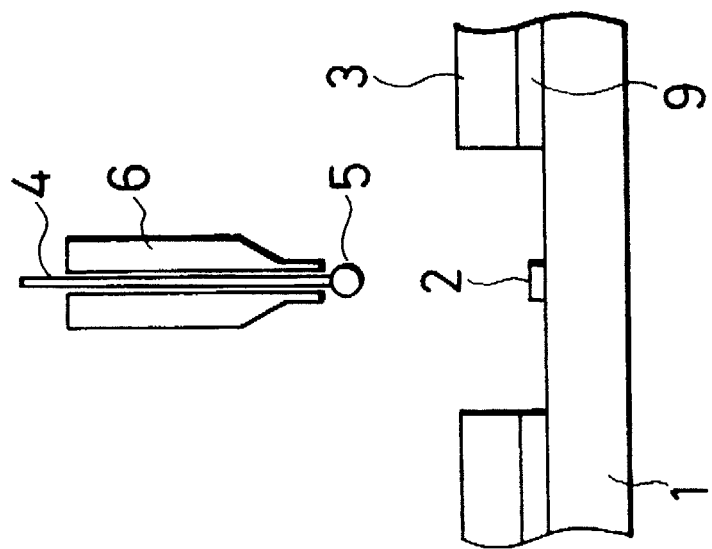
Figure 2D:
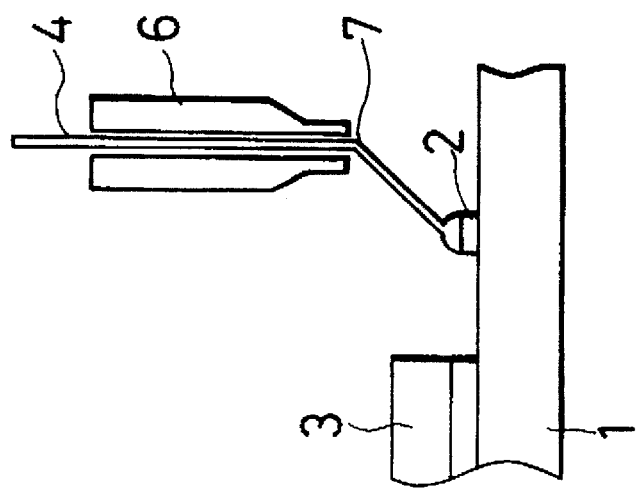
Figure 2E:
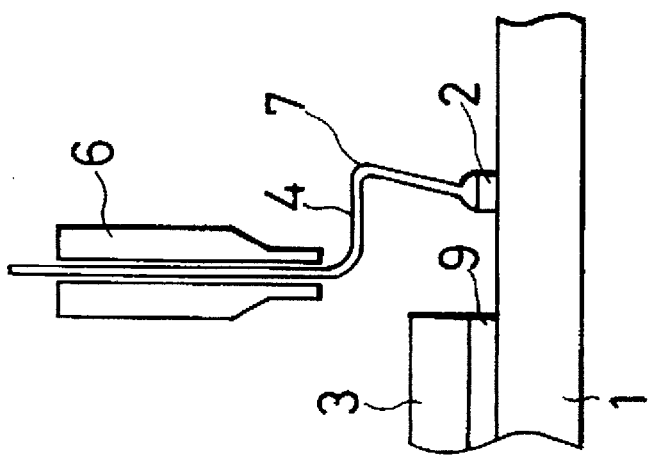
Figure 2F:
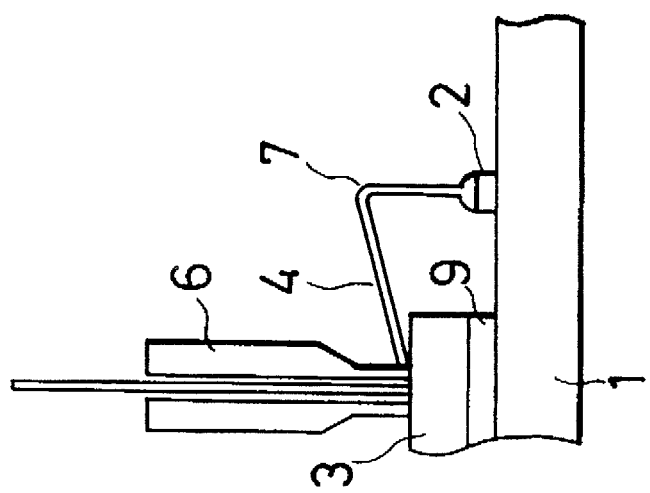
Figure 3A:
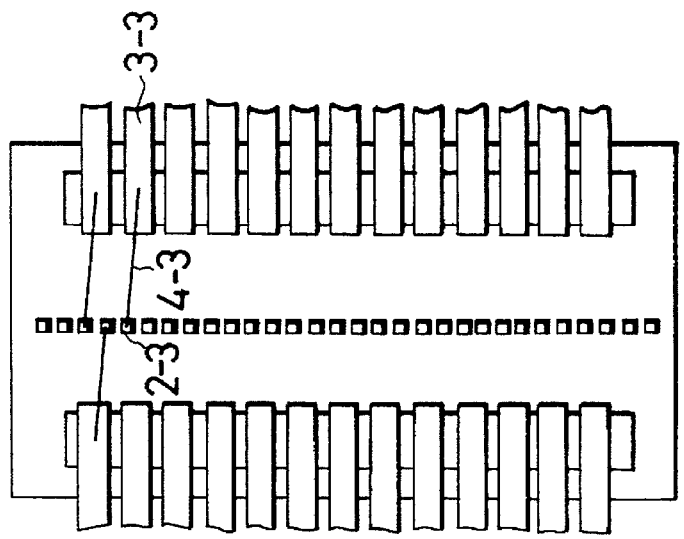
FIGS. 3A to 3F are plan views of a semiconductor device showing a conventional order of wire-bonding.
Figure 3B:
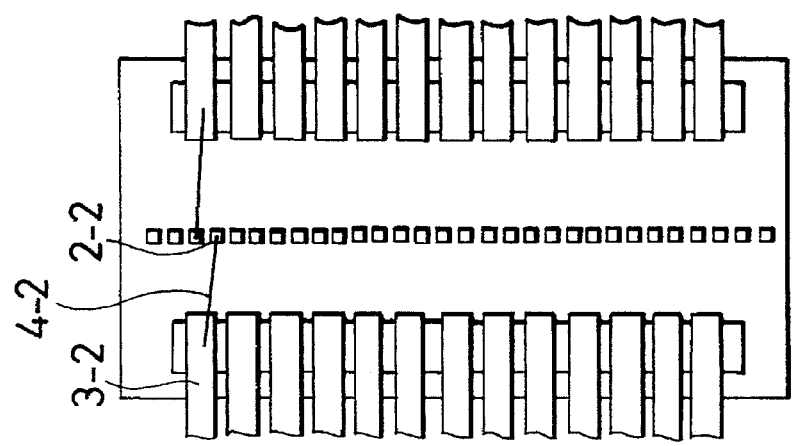
Figure 3C:
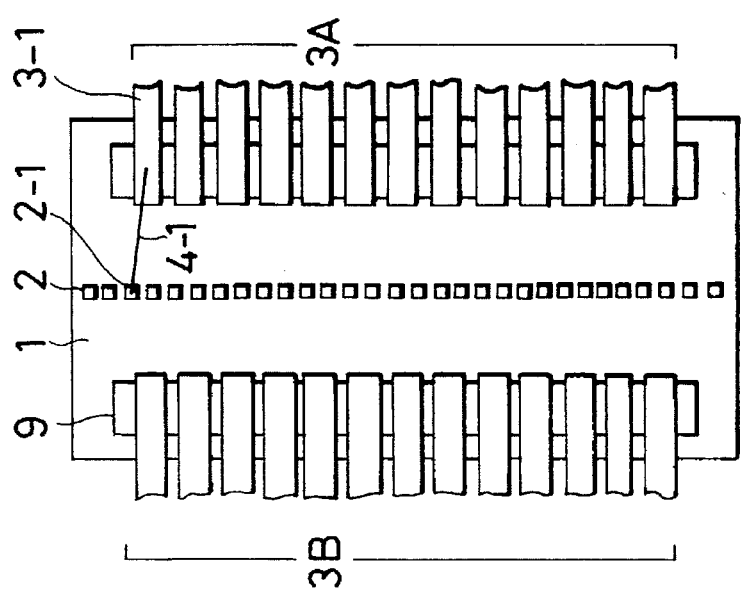
Figure 3F:
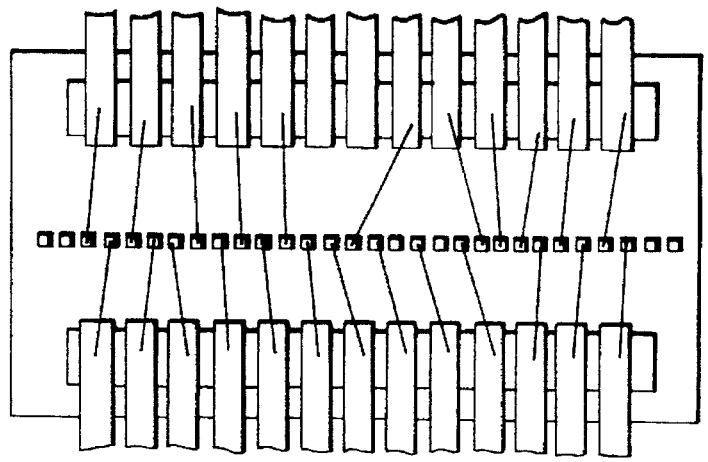
Figure 3E:
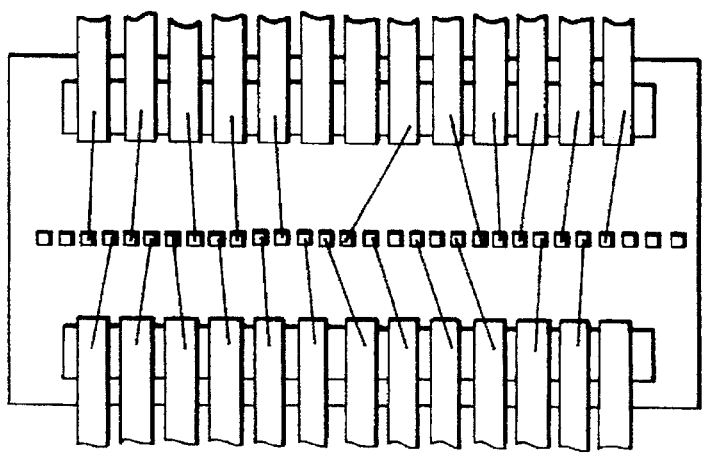
Figure 3D:
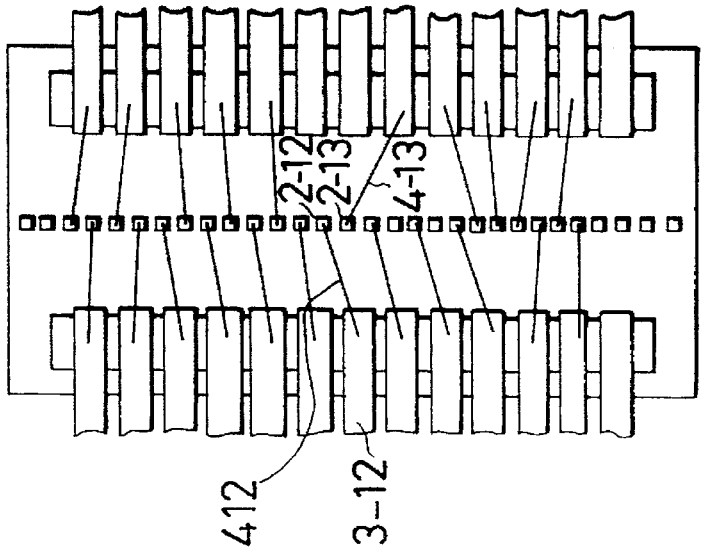
Figure 6:
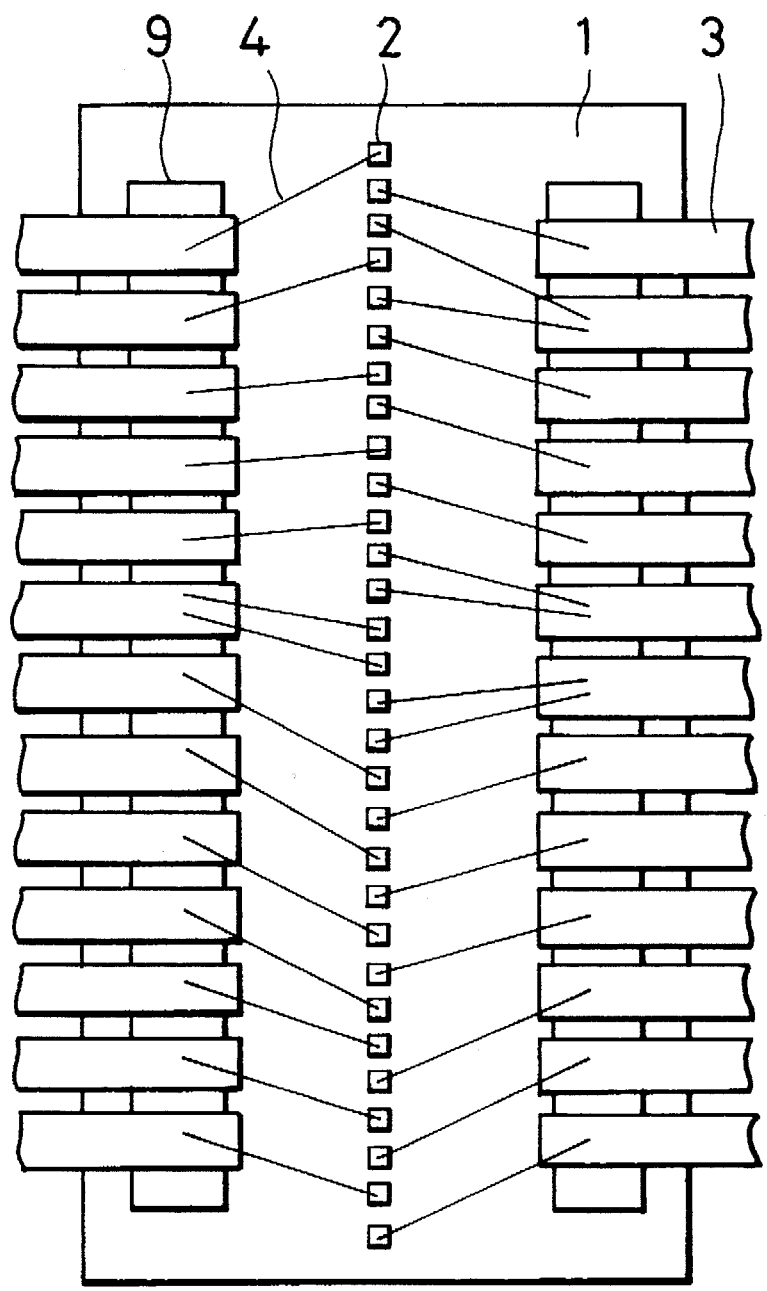
FIG. 6 is a plan view illustrating a semiconductor device on which a plurality of wire-bonded electrodes and leads are disposed.

Hence, it is now possible to design a semiconductor device and leads without paying attention to such interference. For instance, wire-bonding as shown in FIG. 1 is possible, but wire-bonding as shown in FIG. 6 is impossible by a conventional method of wire-bonding. On the other hand, the method in accordance with the invention makes it possible to carry out wire-bonding as shown in FIG. 6 as well as wire-bonding as shown in FIG. 1, which brings an advantage of increased designability in designing a semiconductor device.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method of determining an order of wire-bonding between a plurality of leads and a plurality of electrodes, said leads comprising two arrays, said electrodes being disposed intermediate between said two arrays of leads in a line on a semiconductor, said method comprising the steps of:

surveying whether, if a first wire for connecting a first electrode to a first lead is extended beyond said first electrode, said extended first wire would intersect with a second wire for connecting a second electrode to a second lead; and carrying out wire-bonding for said first wire and then wire-bonding for said second wire if said extended first wire would intersect with said second wire.

2. A method of determining an order of wire-bonding between a plurality of leads and a plurality of electrodes, said leads comprising two arrays, said electrodes being disposed intermediate between said two arrays of leads in a line on a semiconductor, said method comprising the step of:

determining an order of wire-bonding so that an extension of a line connecting an electrode to a lead associated therewith does not intersect with a wire already having been spanned between an electrode and a lead.

3. A method of determining an order of wire-bonding between first, second, third and fourth electrodes and first, second, third and fourth leads, respectively, said electrodes being disposed in a line on a semiconductor device, said first and second leads being disposed at one of sides of said electrodes and said third and fourth leads being disposed at the other side of said electrodes, said first, second, third and fourth electrodes being adapted to be connected by wire-bonding to said first, third, fourth and second leads, respectively, said method comprising the step of:

determining an order of wire-bonding so that an extension of a line connecting an electrode to a lead associated therewith does not intersect with a wire already having been spanned between an electrode and a lead.

4. The method as set forth in claim 3, wherein wire-bonding is carried out in the following order: said first electrode to said first lead, said second electrode to said third lead, said third electrode to said fourth lead, and said fourth electrode to said second lead.

5. A method of determining an order of wire-bonding between a plurality of leads and a plurality of electrodes, said leads comprising two arrays, said electrodes being disposed intermediate between said two arrays of leads in a line on a semiconductor, said method comprising the steps of:

grouping wire-bonding into a plurality of groups so that an extension of a line connecting an electrode to a lead in a group does not intersect with a line connecting an electrode to a lead in another group;

determining an order of wire-bonding in each of said groups so that an extension of a line connecting an electrode to a lead does not intersect with a wire already having been spanned between an electrode and a lead; and carrying out wire-bonding for each of said groups in any order.

6. A method of determining an order of wire-bonding between a plurality of leads and a plurality of electrodes, said leads comprising two arrays, said electrodes being disposed intermediate between said two arrays of leads in a line on a semiconductor, said method comprising the steps of:

- grouping wire-bonding into a plurality of groups so that an extension of a line connecting an electrode to a lead in a group does not intersect with a line connecting an electrode to a lead in another group;
- determining an order of wire-bonding in each of said groups so that an extension of a line connecting an electrode to a lead does not intersect with a wire already having been spanned between an electrode and a lead; and
- carrying out wire-bonding in accordance with said order having been determined in the previous step independently of an order of carrying out wire-bonding for each of said groups.

7. The method as set forth in claim 5, wherein a wire with which all of said extensions of lines connecting electrodes to leads do not intersect is first wire-bonded.

8. The method as set forth in claim 6, wherein a wire with which all of said extension of lines connecting electrodes to leads do not intersect is first wire-bonded.

* * * * *